(12) United States Patent
Jun et al.

(10) Patent No.: US 10,522,510 B2
(45) Date of Patent: Dec. 31, 2019

(54) HETEROGENEOUS INTEGRATION OF ULTRATHIN FUNCTIONAL BLOCK BY SOLID PHASE ADHESIVE AND SELECTIVE TRANSFER

(71) Applicant: Intel Corporation, Santa Clara, CA (US)

(72) Inventors: Kimin Jun, Hillsboro, OR (US); Jacob M. Jensen, Beaverton, OR (US); Patrick Morrow, Portland, OR (US); Paul B. Fischer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/575,323

(22) PCT Filed: Jun. 26, 2015

(86) PCT No.: PCT/US2015/038156
§ 371 (c)(1),
(2) Date: Nov. 17, 2017

(87) PCT Pub. No.: WO2016/209294
PCT Pub. Date: Dec. 29, 2016

(65) Prior Publication Data
US 2018/0151541 A1 May 31, 2018

(51) Int. Cl.
*H01L 25/00* (2006.01)
*H01L 25/065* (2006.01)
(Continued)

(52) U.S. Cl.
CPC ...... *H01L 25/0657* (2013.01); *H01L 21/6835* (2013.01); *H01L 24/50* (2013.01);
(Continued)

(58) Field of Classification Search
None
See application file for complete search history.

(56) References Cited

U.S. PATENT DOCUMENTS

2006/0264004 A1* 11/2006 Tong ............... H01L 21/76254
438/455
2006/0273319 A1 12/2006 Dairiki et al.
(Continued)

FOREIGN PATENT DOCUMENTS

EP 1936678 6/2008

OTHER PUBLICATIONS

International Preliminary Report on Patentability for International Patent Application No. PCT/US2015/038156, dated Jan. 4, 2018, 10 pages.
(Continued)

*Primary Examiner* — Fernando L Toledo
*Assistant Examiner* — Valerie N Newton
(74) *Attorney, Agent, or Firm* — Schwabe, Williamson & Wyatt, P.C.

(57) ABSTRACT

A method including coupling a device substrate to a carrier substrate; aligning a portion of the device substrate to a host substrate; separating the portion of the device substrate from the carrier substrate; and after separating the portion of the device substrate, coupling the portion of the device substrate to the host substrate. A method including coupling a device substrate to a carrier substrate with an adhesive between a device side of the device substrate and the carrier substrate; after coupling the device substrate to the carrier substrate, thinning the device substrate; aligning a portion of the thinned device substrate to a host substrate; separating the portion of the device substrate from the carrier substrate; and coupling the separated portion of the device substrate to the host substrate. An apparatus including a substrate including
(Continued)

a submicron thickness and a device layer coupled to a host substrate in a stacked arrangement.

20 Claims, 9 Drawing Sheets

(51) Int. Cl.
    *H01L 25/07*     (2006.01)
    *H01L 25/16*     (2006.01)
    *H01L 23/00*     (2006.01)
    *H01L 21/683*     (2006.01)

(52) U.S. Cl.
    CPC .......... *H01L 24/86* (2013.01); *H01L 25/0655* (2013.01); *H01L 25/072* (2013.01); *H01L 25/16* (2013.01); *H01L 25/50* (2013.01); *H01L 2221/6834* (2013.01); *H01L 2221/68322* (2013.01); *H01L 2221/68327* (2013.01); *H01L 2221/68368* (2013.01); *H01L 2221/68381* (2013.01); *H01L 2224/8612* (2013.01); *H01L 2224/8689* (2013.01); *H01L 2224/86214* (2013.01); *H01L 2224/95001* (2013.01); *H01L 2225/06579* (2013.01)

(56) References Cited

U.S. PATENT DOCUMENTS

| | | |
|---|---|---|
| 2007/0075726 A1* | 4/2007 | Chan .................. G01R 1/06711 |
| | | 324/754.18 |
| 2010/0072594 A1 | 3/2010 | Kerr et al. |
| 2010/0258543 A1 | 10/2010 | Mizuno |
| 2011/0165707 A1 | 7/2011 | Lott et al. |
| 2012/0313227 A1 | 12/2012 | Or-Bach et al. |
| 2014/0332148 A1 | 11/2014 | Majumdar et al. |

OTHER PUBLICATIONS

International Search Report and Written Opinion for International Patent Application No. PCT/US2015/038156 dated Mar. 31, 2016, 13 pgs.

Search Report for European Patent Application No. 15896577.2, dated Jan. 4, 2019, 10 pgs.

Office Action from Taiwan Patent Application No. 105115777, dated Oct. 22, 2019, 8 pgs.

* cited by examiner

HETEROGENEOUS INTEGRATION OF ULTRATHIN FUNCTIONAL BLOCK BY SOLID PHASE ADHESIVE AND SELECTIVE TRANSFER

CROSS-REFERENCE TO RELATED APPLICATION

This patent application is a U.S. National Phase Application under 35 U.S.C. § 371 of International Application No. PCT/US2015/038156, filed Jun. 26, 2015, entitled "HETEROGENEOUS INTEGRATION OF ULTRATHIN FUNCTIONAL BLOCK BY SOLID PHASE ADHESIVE AND SELECTIVE TRANSFER," which designates the United States of America, the entire disclosure of which is hereby incorporated by reference in its entirety and for all purposes.

BACKGROUND

Field

Three-dimensional integrated circuits.

Description of Related Art

Vertical stacking (z-dimension) of wafers and/or dies to form three-dimensional integrated circuits offer improved performance at reduced power and a smaller xy-dimensions foot print compared to their two-dimensional counterparts.

A common technique for forming a three-dimensional integrated circuit is to thin the original wafer by micromachining processes, followed by the transfer of the entire wafer or scribed dies of the wafer to a host wafer. The thinning process and interlayer interface dimension tends to be limited by the process capabilities. With regard to the thinning process, while being thinned, the original wafer is held by a temporary adhesive, typically of a polymer material. Because of elasticity and thickness variation of polymer material adhesives, extreme wafer thinning, such as sub-10 µm, is difficult. With regard to transfer mechanisms, full wafer-level stacking has advantages over scribed-die transfer because a thinned wafer can be handled by full size temporary carrier wafers. When die- or small mesa-stacking is pursued, individual die or islands must be handled by pick-and-place mechanisms at one point of the flow. This requires minimum size and mechanical strength, so extremely small and thin die cannot be assembled in a readily manner.

DETAILED DESCRIPTION

A three-dimensional integrated circuit and a method of forming a three-dimensional integrated circuit is described. A representative method of forming such a structure includes coupling a device substrate to a carrier substrate through a solid phase adhesive. A portion of the device substrate is aligned to a host substrate and separated from the carrier substrate by, for example, electromagnetic radiation. Exposing the adhesive to electromagnetic radiation at least weakens the adhesive allowing the separation and transfer of the portion of the device substrate to a host substrate. Further processing of the assembly (portion of device substrate plus host substrate) may proceed representatively including but not limited to, forming conductive traces between the portion of the device substrate and the host substrate and also to separate an assembled three-dimensional integrated circuit from the structure.

Figure 1:
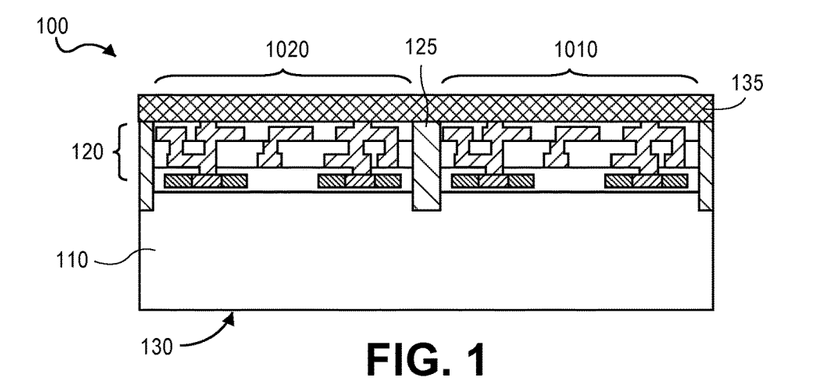
FIG. 1 illustrates a device substrate such as a wafer that includes a number of integrated circuit dies formed thereon.

FIGS. 1-7 show an embodiment of forming a three-dimensional integrated circuit. Referring to FIG. 1, FIG. 1 illustrates a device substrate such as a wafer that includes a number (a plurality) of integrated circuit dies formed thereon. In this embodiment, substrate 100 includes semiconductor substrate 110 having device side 120 including a number of devices thereon (e.g., integrated circuit devices) and backside 130. FIG. 1 illustrates structure 100 including die 1010 and die 1020. Each die is separated, in this embodiment, by a scribe trench having a scribe material of, for example, insulating material 125 (e.g., silicon dioxide). Overlying device layer 120 of structure 100 is cap layer 135 of, for example, a dielectric material such as silicon dioxide or a dielectric material having a dielectric constant less than a dielectric constant of silicon dioxide.

Figure 2:
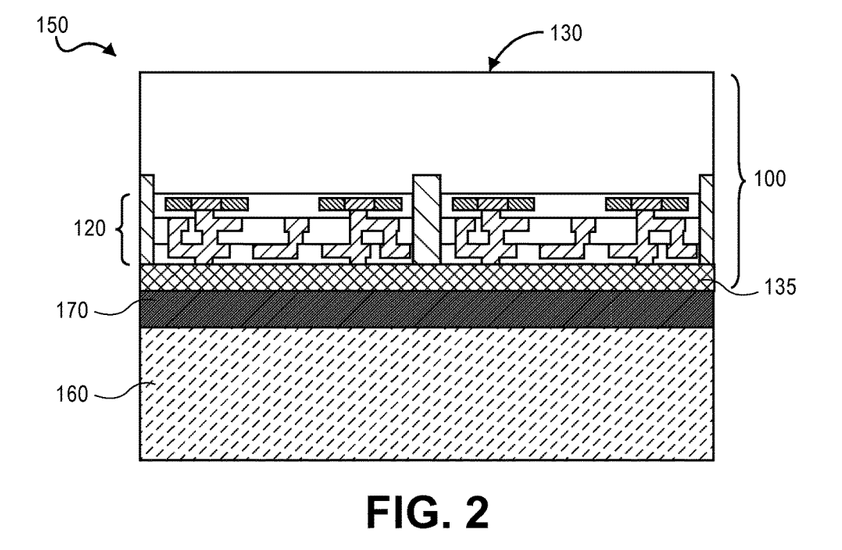
FIG. 2 shows an assembly of the structure of FIG. 1 attached to a carrier.

FIG. 2 shows the structure of FIG. 1 following the attachment of structure 100 to a carrier to form a composite assembly of the integrated circuit device structure and the carrier. FIG. 2 shows assembly 150 including structure 100 attached to carrier 160 through a device side of structure 100. In one embodiment, a solid phase adhesive is introduced to at least one of the device side of structure 100 and to carrier 160 and the carrier and structure are bonded through the adhesive. FIG. 2 shows adhesive layer 170. In one embodiment, carrier 160 is a transparent material such as glass or quartz. The device structure is flipped and bonded to the transparent carrier with a solid phase adhesive therebetween. In one embodiment, the solid phase adhesive provides a rigid or non-flexible support or hold of device structure 100 to carrier 160. Examples of a solid phase adhesive that provides a rigid support includes hydrogenated amorphous silicon, carbon doped silicon oxide and metal.

Figure 3:
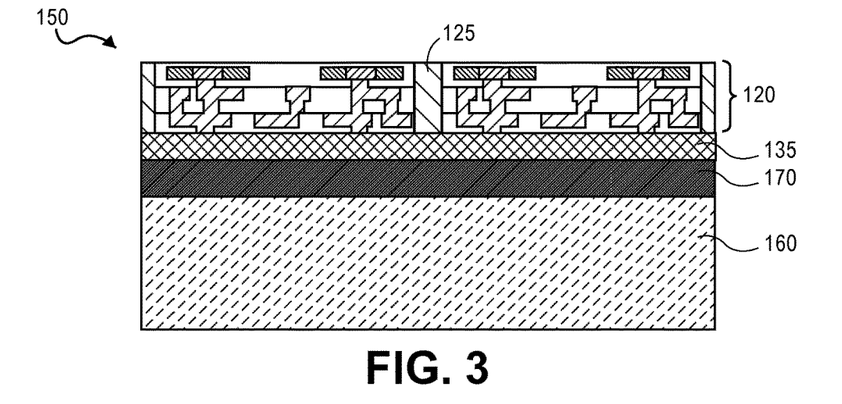
FIG. 3 shows the assembly of FIG. 2 following the thinning of the device structure.

FIG. 3 shows the structure of FIG. 2 following the thinning of device structure 100. In one embodiment, device structure 100 may be thinned by one or more micromachining techniques. These techniques representatively include dry etch, wet etch, mechanical grinding and chemical-mechanical polishing. In one embodiment, device structure 100 is thinned to a submicron thickness, such as a thickness on the order of a few hundred nanometers. By using a solid phase adhesive, the carrier provides a rigid support of device structure 100 allowing a desired thickness of the device substrate to be minimized. In one embodiment, device structure 100 may be thinned to expose scribe trench material 125. Where such scribe material is exposed, the scribe line material may be etched away using a suitable etchant to selectively remove the material relative to the device structure.

Figure 4:
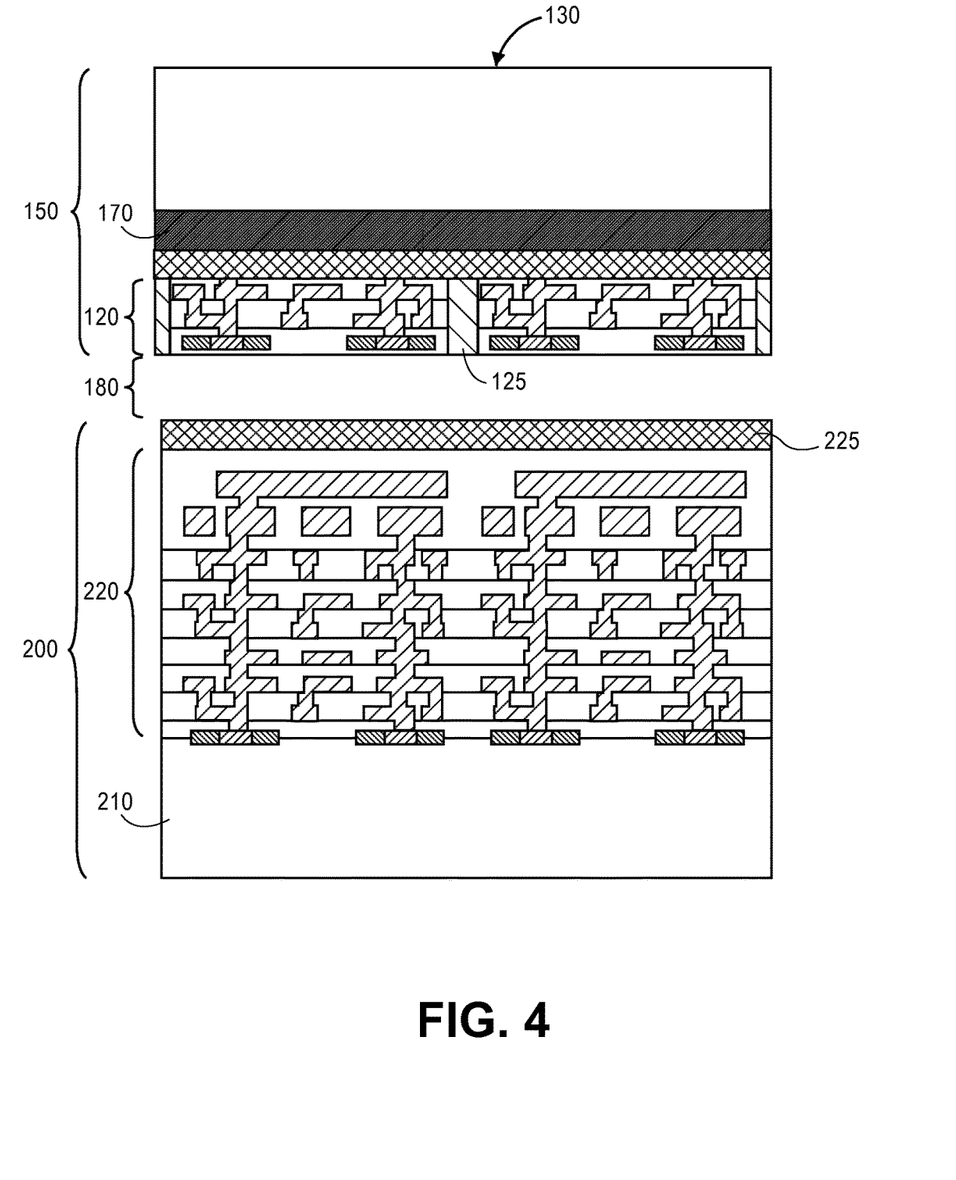
FIG. 4 shows the assembly of FIG. 3 following the alignment of the assembly to a host wafer.

FIG. 4 shows the structure of FIG. 3 following the alignment of assembly 150 of a plurality of integrated circuit devices (structure 100) and carrier 160 to a host wafer. In one embodiment, host wafer 200 includes semiconductor substrate 210 and device layer 220 formed in and on a surface of the structure (a device side of the structure). An ultimate layer on device layer 220 is cap layer 225 of, for example, a dielectric material (e.g., silicon dioxide or a low material).

FIG. 4 shows device/carrier stack 150 aligned device side down with host wafer 210. FIG. 4 also shows gap 180 representing a separation or gap between device layer 120 of device/carrier stack 150 and cap layer 225 of host wafer 210. In another embodiment, there is no gap (e.g., gap thickness equal zero) between the structures.

Figure 5:
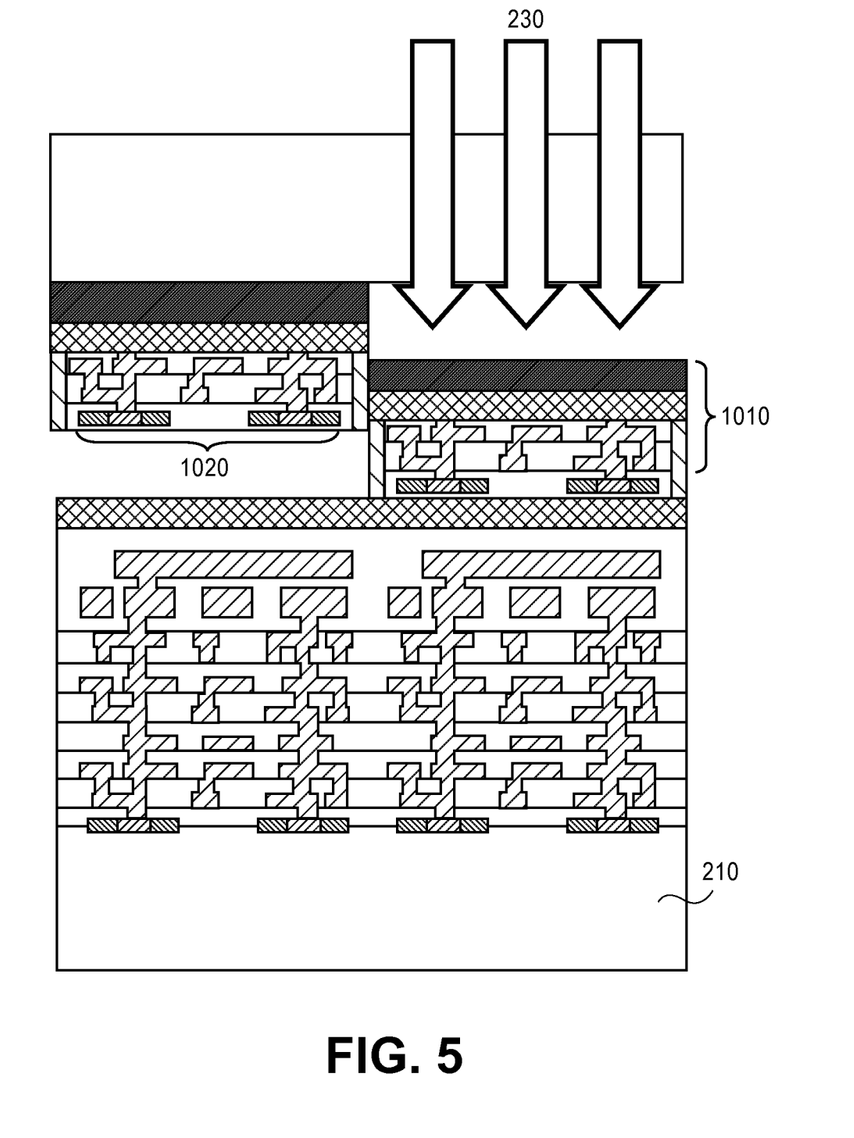
FIG. 5 shows the assembly of FIG. 3 following the separating of a portion of the device substrate from the assembly and following the transferring of that portion to the host wafer.

FIG. 5 shows the assembly of FIG. 3 following the separating of a portion of device substrate 100 from assembly 150. FIG. 5 shows die 1010 separated from device substrate 100. In one embodiment, electromagnetic radiation is used to separate die 1010. The electromagnetic radiation (e.g., laser), in one embodiment, is directed at adhesive layer and is sufficient to, in one embodiment, disrupt the bonding between the adhesive and carrier 160 allows selected radiation of an area to be transferred. In one embodiment, a scribe line trench defines an area to be transferred (defines an area of die 1010). In another embodiment, the electromagnetic radiation may be scanned stepwise across the entire substrate to transfer the entirety of the device layer (an entire portion). The electromagnetic radiation allows for the separation through the absorption of the radiation by the adhesive layer. The adhesive layer absorbs the radiation and blisters to release the portion of the device layer on the desired location of the host structure.

Figure 6:
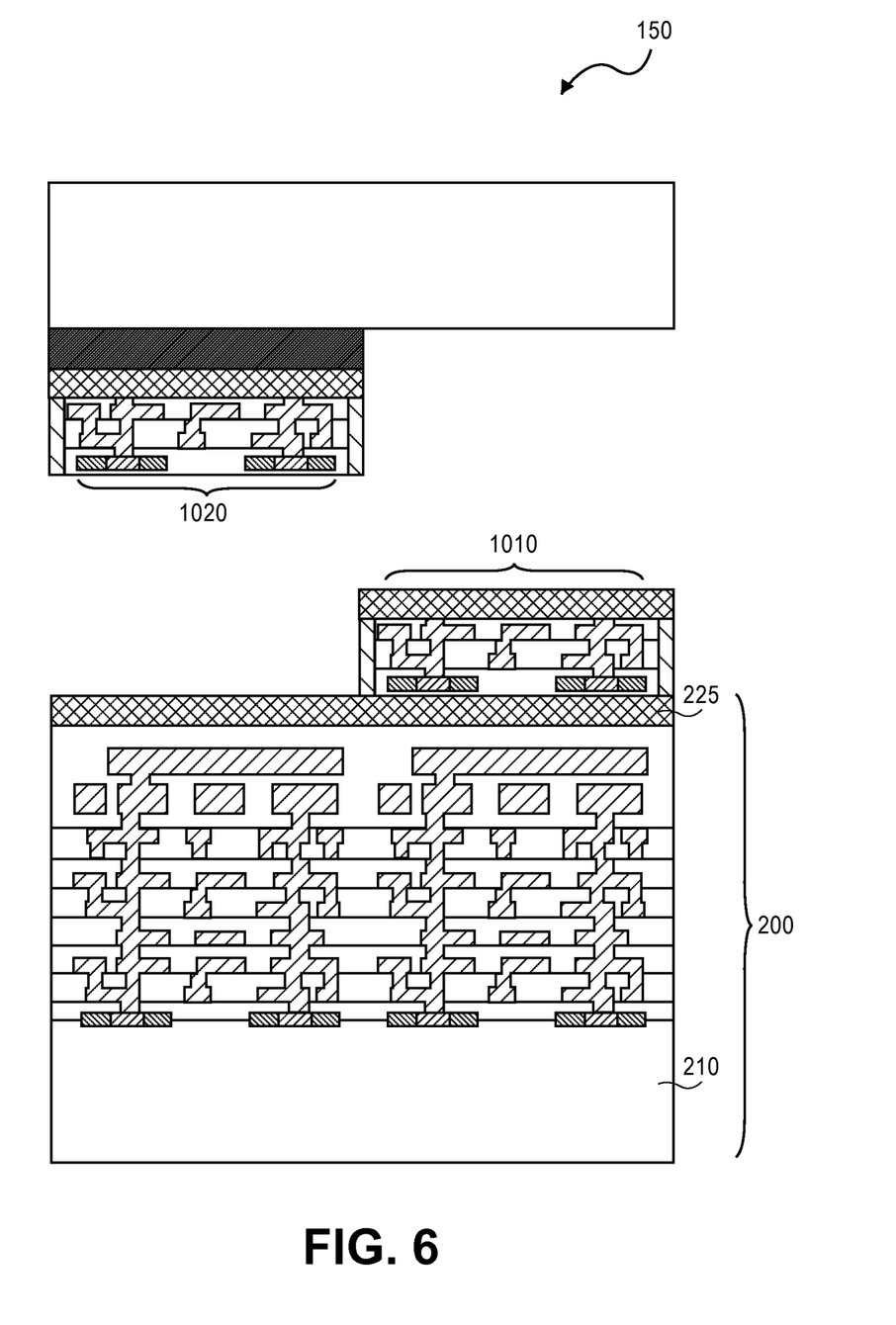
FIG. 6 shows the structure of FIG. 5 following the connection of a portion of a device layer to the host structure.

FIG. 6 shows the host wafer of FIG. 5 following the connection of a portion of a device layer to host wafer 200. In this embodiment, device portion including die 1010 is separated from assembly 150 and is in contact with and connected to cap layer 225 of host wafer 200. Following the transfer of one or more portions of device structure 100 from assembly 150, the host structure (e.g., host wafer 200) including the transferred portions of the device layer may be processed through further layers.

Figure 7:
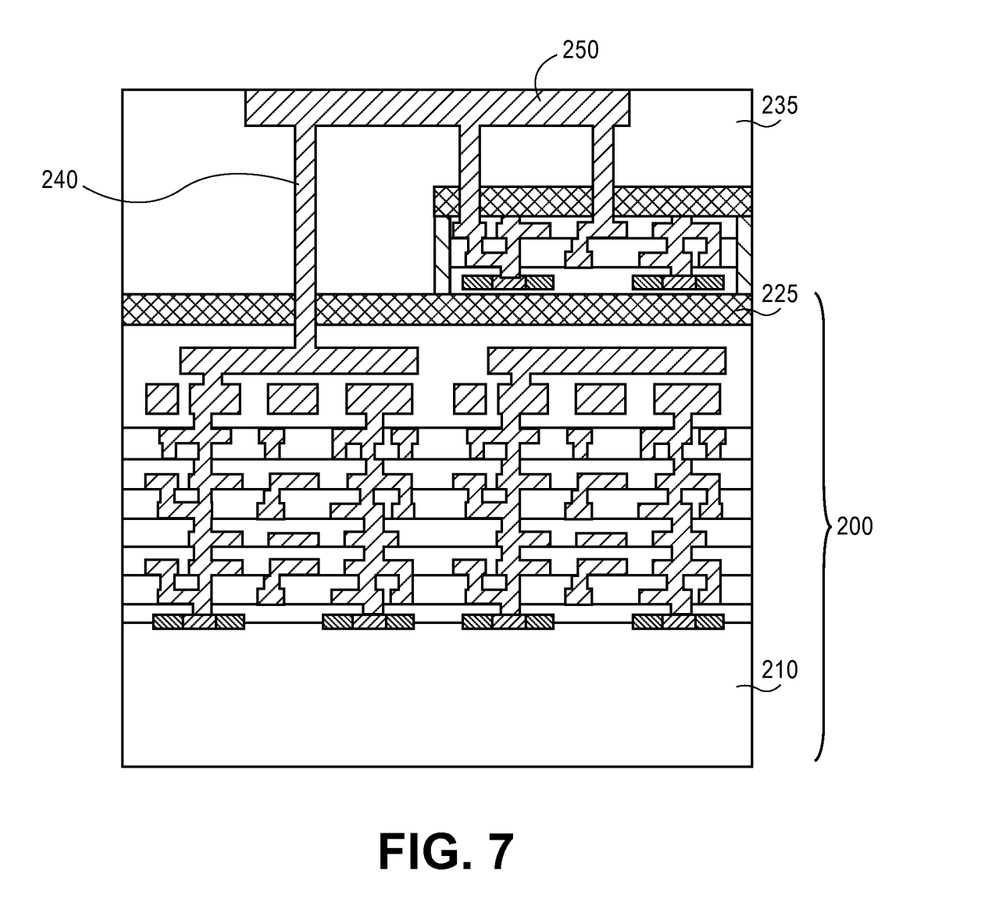
FIG. 7 shows the structure of FIG. 6 following the transfer of a device layer portion to the host structure and the further processing steps of adding one or more conductive vias and dielectric material in a dielectric layer on a superior surface thereof.

FIG. 7 shows the structure of FIG. 6 following the transfer of device layer portion 1010 (e.g., a die) to host wafer 200 and the further processing of adding one or more conductive vias 240 and a next level interconnect 250 and dielectric material layers on dielectric layer 235 (on a superior surface thereof as viewed). Representatively, dielectric material 235 such as silicon dioxide is deposited followed by formation of one or more conductive vias and interconnect. Conductive vias 240 and one or more interconnect 250 can be made by forming openings to a desired interconnect (e.g., via etch) followed by an electrodeposition process (seed, mask, electrodeposit) of a metal material such as copper. Following the formation of any additional layers, host wafer 200 may be singulated into one or more integrated circuit dies. FIG. 7 may be a representative of a singulated die.

The above-described process allows an ultra thin submicron device portion (e.g., die) to be transferred to a host structure in the formation of a three-dimensional integrated circuit. Because the transferred device layer is relatively thin and faces device layer of the host structure, the device layer can be fully embedded in a three-dimensional stack allowing further fabrication processing which is damascene metallization layers.

Figures 8A, 8B, 8C, 9:
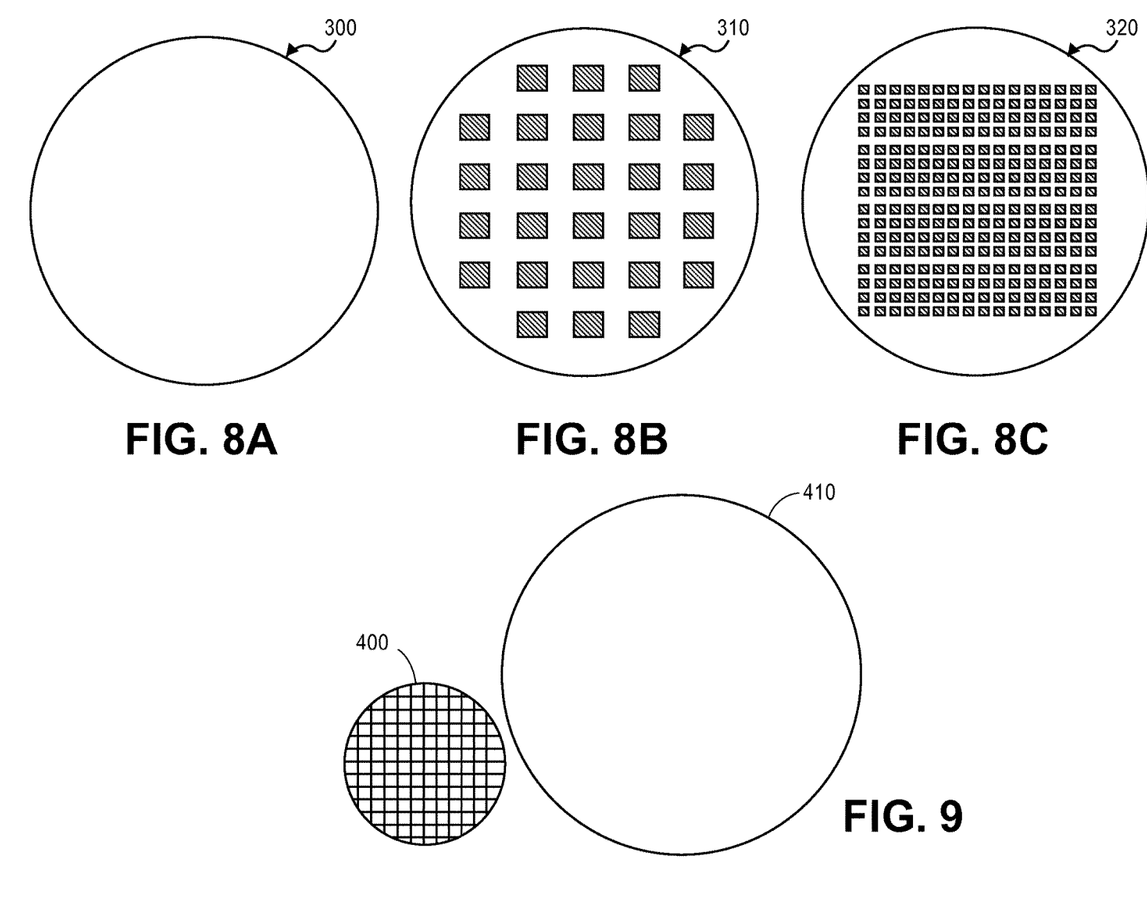
FIGS. 8A-8C show the top views of the wafers having various designated areas for transfer to a host wafer.
FIG. 9 shows the top views of substrates of different sizes.

According to the above-described process, various sidewalls of transferred portion can be accommodated. The side of the transferred device portion is controlled by electromagnetic radiation exposure. Thus, what is transferred depends primarily on the extent of an adhesive layer to electromagnetic radiation. FIGS. 8A-8C shows the wafers having various designated areas for transfer to a host wafer. In FIG. 8A, an entire wafer level may be transferred to a host structure. FIG. 8B is illustrated of a die level transfer where the device substrate is divided into a number of die. FIG. 8C is representative of a small mason transfer.

In the process such as described above where electromagnetic radiation is utilized to blister an adhesive and release a portion of the device substrate, it is possible to integrate to different types of wafers, such as wafers having devices formed in a different semiconductor substrate. This is particularly beneficial when different materials are heterogeneously integrated, such as 300 millimeters silicon wafers and 150 millimeters gallium nitride wafers as illustrated in FIG. 9 with the silicon wafer represented by wafer 410 and the gallium nitride wafer represented by wafer 400.

Figure 10:
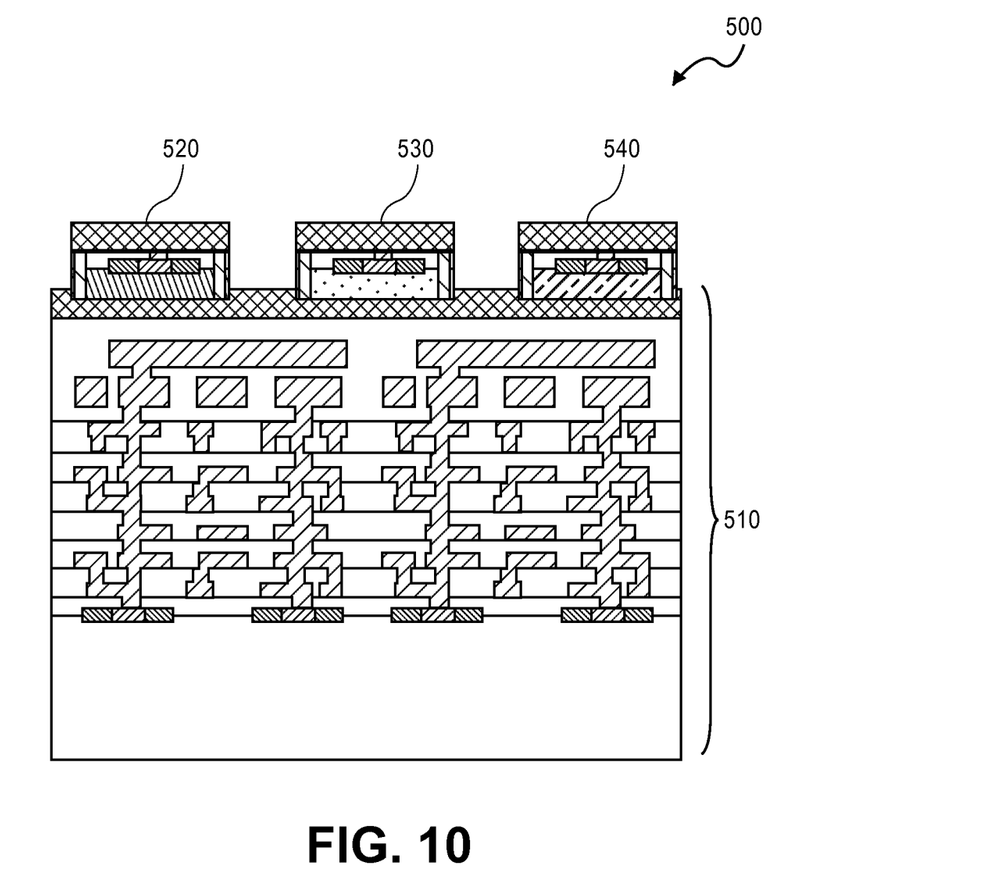
FIG. 10 shows a cross-sectional side view of a three-dimensional integrated circuit device including a host structure and individual transferred device portion connected to a device layer of the host structure.

Multiple rounds of transfer (e.g., sequential transfer) are also possible. Electromagnetic radiation induced blistering of enables remote transfer of device portion, allowing gaps between the device/carrier stack and host wafer. In this manner, sequential transfer of multiple portions can be conducted without mutual interference. FIG. 10 shows a cross-sectional side view of a three-dimensional integrated circuit device including host structure 510 and individual transferred device portion connected to a device layer of the host structure. In this embodiment, the three-dimensional integrated circuit structure 500 includes a host integrated circuit 510 and three integrated circuit device portions including device portion 520, device portion 530 and device portion 540 attached to a device side thereof. Possible combinations for the host substrate and the individual device portion substrates include silicon, germanium, indium gallium arsenide, gallium arsenide, gallium nitride, indium phosphide and silicon carbide. Since portions 520-540 are thinned from a bulk substrate, it is possible to use either the bulk substrate or an epitaxial film as a starting material. There is also no need to prepare semiconductor on insulator-like wafers.

Figure 11:
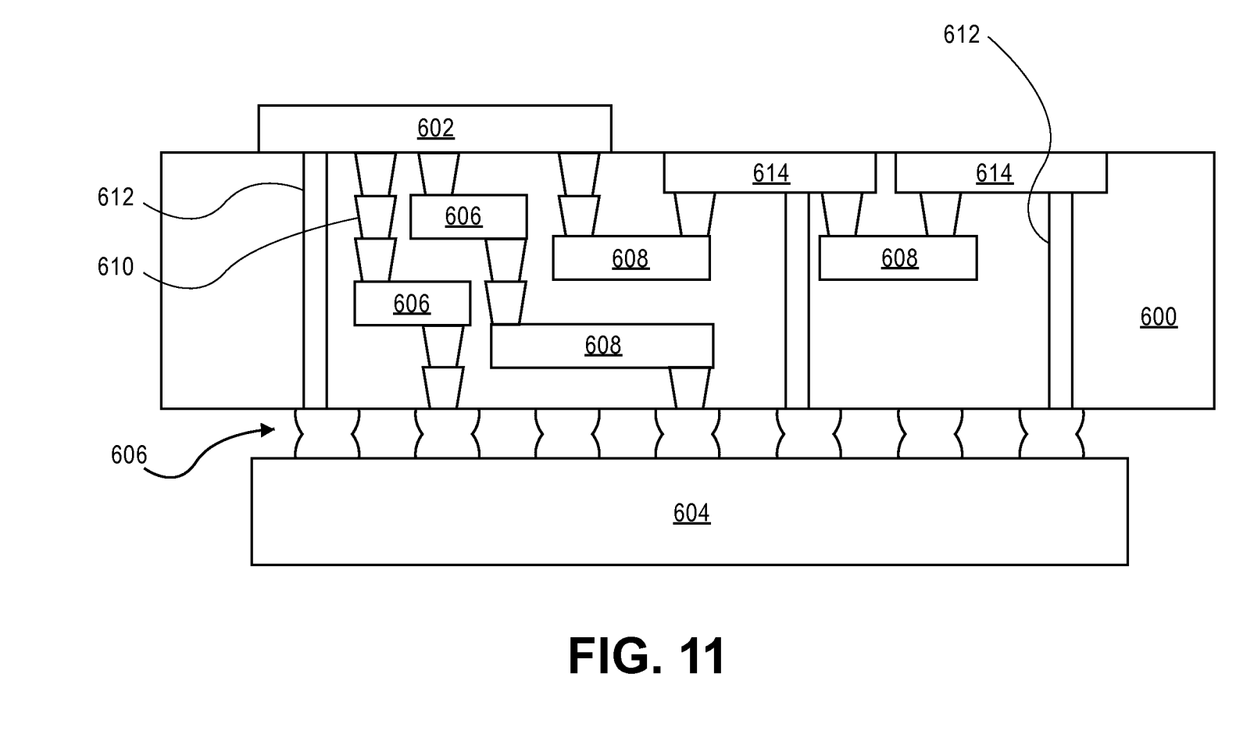
FIG. 11 is an interposer implementing one or more embodiments.

FIG. 11 illustrates an interposer 600 that includes one or more embodiments. The interposer 600 is an intervening substrate used to bridge a first substrate 602 to a second substrate 604. The first substrate 602 may be, for instance, an integrated circuit die (e.g., a three-dimensional integrated circuit as described herein). The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600.

In accordance with embodiments, apparatuses or processes disclosed herein may be used in the fabrication of interposer 600.

Figure 12:
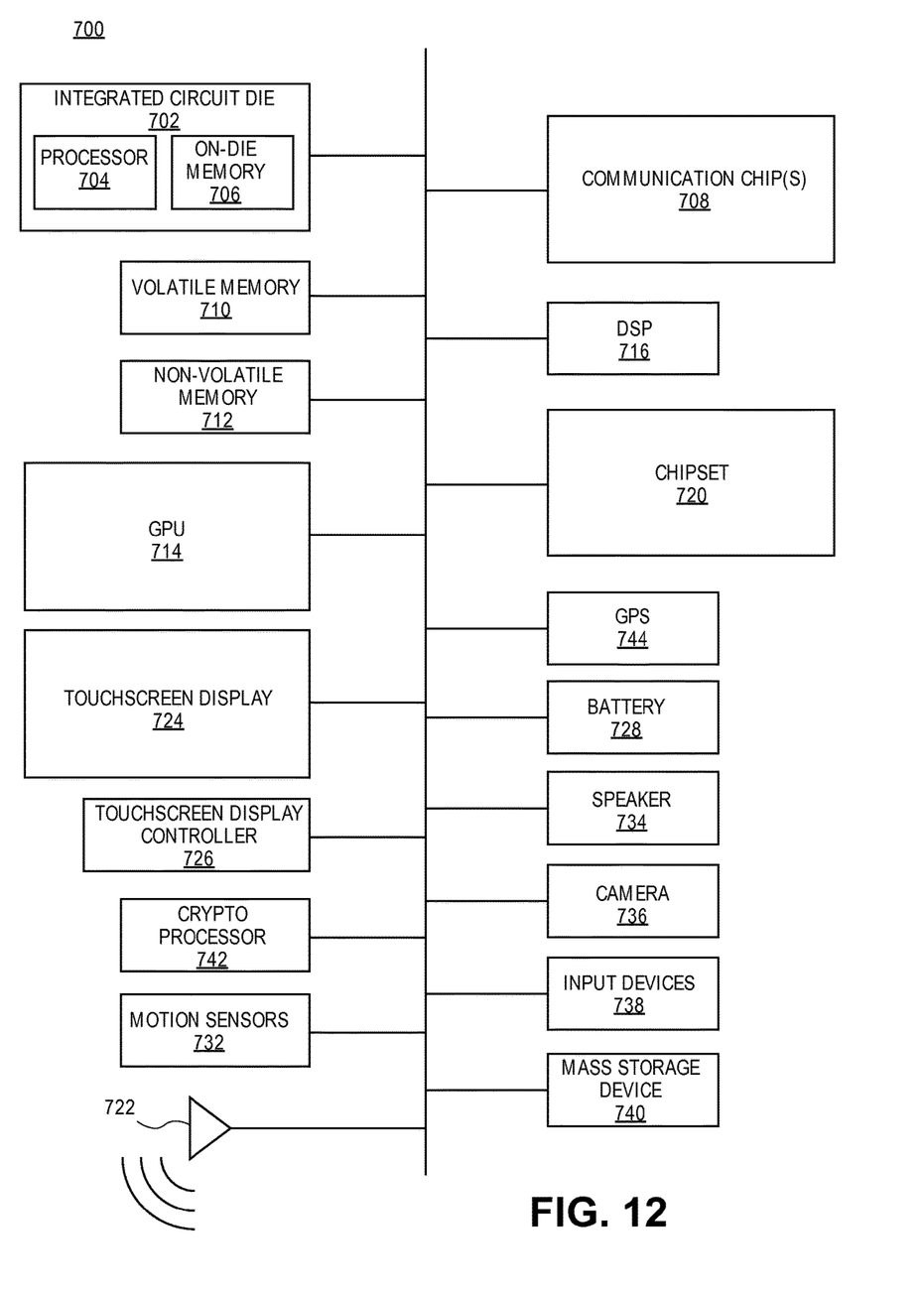
FIG. 12 illustrates an embodiment of a computing device.

FIG. 12 illustrates computing device 700 in accordance with one embodiment. Computing device 700 may include a number of components. In one embodiment, these components are attached to one or more motherboards. In an alternate embodiment, these components are fabricated onto a single system-on-a-chip (SoC) die rather than a motherboard. The components in computing device 700 include, but are not limited to, integrated circuit die 702 (e.g., a three-dimensional integrated circuit device) and at least one communication chip 708. In some implementations communication chip 708 is fabricated as part of integrated circuit die 702. Integrated circuit die 702 may include CPU 704 as well as on-die memory 706, often used as cache memory, that can be provided by technologies such as embedded DRAM (eDRAM) or spin-transfer torque memory (STTM or STTM-RAM).

Computing device 700 may include other components that may or may not be physically and electrically coupled to the motherboard or fabricated within an SoC die. These other components include, but are not limited to, volatile memory 710 (e.g., DRAM), non-volatile memory 712 (e.g., ROM or flash memory), graphics processing unit 714 (GPU), digital signal processor 716, crypto processor 742 (a specialized processor that executes cryptographic algorithms within hardware), chipset 720, antenna 722, display or touchscreen display 724, touchscreen controller 726, battery 728 or other power source, a power amplifier (not shown), global positioning system (GPS) device 744, compass 730, motion coprocessor or sensors 732 (that may include an accelerometer, a gyroscope, and a compass), speaker 734, camera 736, user input devices 738 (such as a keyboard, mouse, stylus, and touchpad), and mass storage device 740 (such as hard disk drive, compact disk (CD), digital versatile disk (DVD), and so forth).

Communications chip 708 enables wireless communications for the transfer of data to and from computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 708. For instance, a first communication chip 708 may be dedicated to shorter range wireless communications such as Wi-Fi and Bluetooth and a second communication chip 708 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

Processor 704 and communication chip 708, in one embodiment, may be part of or each a three-dimensional integrated circuit formed in accordance with processes described herein.

In various embodiments, computing device 700 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 700 may be any other electronic device that processes data.

EXAMPLES

Example 1 is a method including coupling a device substrate to a carrier substrate; aligning a portion of the device substrate to a host substrate; separating the portion of the device substrate from the carrier substrate; and after separating the portion of the device substrate, coupling the portion of the device substrate to the host substrate.

In Example 2, the device wafer of Example 1 includes a device side and a back side and coupling the device substrate to the carrier substrate includes coupling the at the device side.

In Example 3, prior to coupling the device substrate to a carrier substrate, the method of Example 1 includes applying an adhesive to one of the device substrate and the carrier substrate and coupling includes coupling the device substrate to the carrier substrate by the carrier substrate.

In Example 4, the adhesive of Example 3 includes a solid phase adhesive.

In Example 5, separating in any of Example 3 or 4 includes exposing the adhesive to electromagnetic radiation.

In Example 6, the device substrate of any of Examples 1-5 includes a plurality of die and separating a portion of the device substrate comprises separating less than all of the plurality of die.

In Example 7, the device substrate of any of Examples 1-6 includes a first semiconductor material and the host substrate includes a different second semiconductor material.

In Example 8, the portion of the device substrate of any of Examples 1-7 includes a first device substrate, the method further including after coupling the first device substrate, coupling a second device substrate to the host substrate.

In Example 9, the first device substrate of Example 8 includes a first semiconductor material and the second device substrate includes a different second semiconductor material.

Example 10 is a method including coupling a device substrate to a carrier substrate with an adhesive between a device side of the device substrate and the carrier substrate; after coupling the device substrate to the carrier substrate, thinning the device substrate; aligning a portion of the thinned device substrate to a host substrate; separating the portion of the device substrate from the carrier substrate; and coupling the separated portion of the device substrate to the host substrate.

In Example 11, the adhesive of Example 10 includes a solid-phase adhesive.

In Example 12, thinning of any of Example 10 or 11 includes thinning the device substrate to a submicron thickness.

In Example 13, separating of any of Examples 10-12 includes exposing the adhesive to electromagnetic radiation.

In Example 14, the device substrate of any of Examples 10-13 includes a first semiconductor material and the host substrate includes a different second semiconductor material.

In Example 15, the portion of the device substrate of any of Examples 10-14 includes a first device substrate, the method further including after coupling the first device substrate, coupling a second device substrate to the host substrate.

In Example 16, the first device substrate of Example 15 includes a first semiconductor material and the second device substrate includes a different second semiconductor material.

Example 17 is an apparatus including a device substrate including a sub micron thickness and a device layer coupled to a host substrate in a stacked arrangement.

In Example 18, the device substrate of Example 17 includes a first semiconductor material and the host substrate includes a different second semiconductor material.

In Example 19, the device substrate of any of Examples 17-18 includes a first device substrate, the apparatus further including a second device substrate coupled to the host substrate in a stacked arrangement.

In Example 20, the first device substrate of any of Example 17-19 includes a first semiconductor material and the second device substrate includes a different second semiconductor material.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made to the invention in light of the above detailed description. The terms used in the following claims should not be construed to limit the invention to the specific implementations disclosed in the specification and the claims. Rather, the scope is to be determined entirely by the following claims, which are to be construed in accordance with established doctrines of claim interpretation.

The invention claimed is:

1. A method comprising:
   coupling a device substrate to a carrier substrate;
   aligning a portion of the device substrate to a host substrate, the host substrate comprising a cap layer above a device layer;
   separating the portion of the device substrate from the carrier substrate;
   after separating the portion of the device substrate, coupling the portion of the device substrate to the host substrate, wherein coupling the portion of the device substrate to the host substrate comprises attaching the portion of the device substrate to the cap layer, the portion of the device substrate above the cap layer, wherein the cap layer is between the portion of the device substrate and the device layer of the host substrate; and
   electrically coupling a top side of the portion of the device substrate to an interconnect in a top portion of the host substrate with an interconnect and one or more vias.

2. The method of claim 1, wherein the device wafer comprises a device side and a back side and coupling the device substrate to the carrier substrate comprises coupling the at the device side.

3. The method of claim 1, wherein prior to coupling the device substrate to a carrier substrate, the method comprises applying an adhesive to one of the device substrate and the carrier substrate and coupling comprises coupling the device substrate to the carrier substrate by the carrier substrate.

4. The method of claim 3, wherein the adhesive comprises a solid phase adhesive.

5. The method of claim 3, wherein separating comprises exposing the adhesive to electromagnetic radiation.

6. The method of claim 1, wherein the device substrate comprises a plurality of die and separating a portion of the device substrate comprises separating less than all of the plurality of die.

7. The method of claim 1, wherein the device substrate comprises a first semiconductor material and the host substrate comprises a different second semiconductor material.

8. The method of claim 1, wherein the portion of the device substrate comprises a first device substrate, the method further comprising after coupling the first device substrate, coupling a second device substrate to the host substrate.

9. The method of claim 8, wherein the first device substrate comprises a first semiconductor material and the second device substrate comprises a different second semiconductor material.

10. A method comprising:
    coupling a device substrate to a carrier substrate with an adhesive between a device side of the device substrate and the carrier substrate;
    after coupling the device substrate to the carrier substrate, thinning the device substrate;
    aligning a portion of the thinned device substrate to a host substrate;
    separating the portion of the device substrate from the carrier substrate, the host substrate comprising a cap layer above a device layer;
    coupling the separated portion of the device substrate to the host substrate, wherein coupling the separated portion of the device substrate to the host substrate comprises attaching the separated portion of the device substrate to the cap layer, the separated portion of the device substrate above the cap layer, wherein the cap layer is between the separated portion of the device substrate and the device layer of the host substrate; and electrically coupling a top side of the portion of the device substrate to an interconnect in a top portion of the host substrate with an interconnect and one or more vias.

11. The method of claim 10, wherein the adhesive comprises a solid-phase adhesive.

12. The method of claim 10, wherein thinning comprises thinning the device substrate to a submicron thickness.

13. The method of claim 10, wherein separating comprises exposing the adhesive to electromagnetic radiation.

14. The method of claim 10, wherein the device substrate comprises a first semiconductor material and the host substrate comprises a different second semiconductor material.

15. The method of claim 10, wherein the portion of the device substrate comprises a first device substrate, the method further comprising after coupling the first device substrate, coupling a second device substrate to the host substrate.

16. The method of claim 15, wherein the first device substrate comprises a first semiconductor material and the second device substrate comprises a different second semiconductor material.

17. An apparatus comprising:

a host substrate comprising a cap layer above a device layer;

a die comprising a sub micron thickness, the die coupled to the host substrate in a stacked arrangement, wherein the host substrate comprises a cap layer above a device layer, and wherein the die is attached to the cap layer of the host substrate, the die above the cap layer, wherein the cap layer is between the die and the device layer of the host substrate, and wherein a top side of the die is electrically coupled to an interconnect in a top portion of the host substrate with an interconnect and one or more vias.

18. The apparatus of claim 17, wherein the die comprises a first semiconductor material and the host substrate comprises a different second semiconductor material.

19. The apparatus of claim 17, further comprising a second die coupled to the host substrate.

20. The apparatus of claim 19, wherein the die comprises a first semiconductor material and the second die comprises a different second semiconductor material.

* * * * *